(12) United States Patent
Chen et al.

(10) Patent No.: US 10,833,135 B2
(45) Date of Patent: Nov. 10, 2020

(54) FLEXIBLE ORGANIC LIGHT EMITTING DIODE DISPLAY DEVICE AND METHOD OF FABRICATING SAME

(71) Applicant: Wuhan China Star Optoelectronics Semiconductor Display Technology Co., Ltd., Wuhan (CN)

(72) Inventors: Jifeng Chen, Wuhan (CN); Yongzhen Jia, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/316,353

(22) PCT Filed: Dec. 20, 2018

(86) PCT No.: PCT/CN2018/122240
§ 371 (c)(1),
(2) Date: Jan. 9, 2019

(87) PCT Pub. No.: WO2020/077800
PCT Pub. Date: Apr. 23, 2020

(65) Prior Publication Data
US 2020/0119110 A1 Apr. 16, 2020

(30) Foreign Application Priority Data
Oct. 16, 2018 (CN) .......................... 2018 1 1200273

(51) Int. Cl.
*H01L 27/32* (2006.01)
*H01L 51/00* (2006.01)
*H01L 51/56* (2006.01)

(52) U.S. Cl.
CPC ...... *H01L 27/3244* (2013.01); *H01L 51/0097* (2013.01); *H01L 51/56* (2013.01)

(58) Field of Classification Search
CPC .. H01L 27/3244; H01L 51/0097; H01L 51/56
USPC .......................................................... 257/40
See application file for complete search history.

(56) References Cited

U.S. PATENT DOCUMENTS

| | | | |
|---|---|---|---|
| 2017/0170206 A1* | 6/2017 | Lee | .......... H01L 51/52 |
| 2017/0323934 A1 | 11/2017 | Ki et al. | |
| 2018/0062090 A1 | 3/2018 | Kim et al. | |
| 2019/0207130 A1 | 7/2019 | He et al. | |

FOREIGN PATENT DOCUMENTS

| | | |
|---|---|---|
| CN | 106716642 | 5/2017 |
| CN | 107799550 | 3/2018 |
| CN | 107972349 | 5/2018 |

(Continued)

*Primary Examiner* — Elias Ullah

(57) ABSTRACT

A flexible organic light emitting diode (OLED) display device and a method for fabricating the same are disclosed. The flexible OLED display device includes a first flexible substrate, an inorganic layer, a second flexible substrate, a thin film transistor (TFT) layer, and an OLED light emitting layer; wherein the flexible OLED display device includes a display area and a non-display area. The first flexible substrate and the inorganic layer are located in the display area, and the second flexible substrate and the TFT layer extend from the display area to the non-display area.

10 Claims, 6 Drawing Sheets

(56) References Cited

FOREIGN PATENT DOCUMENTS

| | | |
|---|---|---|
| CN | 108198842 | 6/2018 |
| CN | 108231800 | 6/2018 |
| CN | 108281387 | 7/2018 |
| CN | 108281576 | 7/2018 |

* cited by examiner

FLEXIBLE ORGANIC LIGHT EMITTING DIODE DISPLAY DEVICE AND METHOD OF FABRICATING SAME

RELATED APPLICATIONS

This application is a National Phase of PCT Patent Application No. PCT/CN2018/122240 having International filing date of Dec. 20, 2018, which claims the benefit of priority of Chinese Patent Application No. 201811200273.5 filed on Oct. 16, 2018. The contents of the above applications are all incorporated by reference as if fully set forth herein in their entirety.

FIELD AND BACKGROUND OF THE INVENTION

The present invention relates to the field of display technologies, and in particular, to a flexible organic light emitting diode (OLED) display device and a method for fabricating the same.

At present, in addition to the opportunity to produce a bendable display or a curved display, a flexible OLED display device can also hide traces and components of a non-display area behind the display area by bending of a substrate, thereby reducing a frame region and increasing screen ratio. An ultra-narrow bottom frame is a relatively successful example of applications of the flexible substrate on the display. The traces and the bonding region are bent and hidden under the display area using the bendable property of the flexible substrate, so that an extension length of the bending region is shorter than that of the original flexible circuit board, and the lower frame is thus shortened. However, how much the lower frame gets reduced depends on the radius of curvature of the flexible substrate, and the smaller the radius, the smaller the lower frame. On the contrary, the larger the radius, the larger the lower frame. When the radius of curvature is smaller, the bending stress at the bending section is greater. The greater the bending stress at the bending section, the greater the possibility of breakage of the metal trace, causing signal interruption. In order to solve the problem of excessive stress at the bending section, the prior art flexible OLED display device applies a UV-curable adhesive on the substrate to be bent. The substrate is then bent after curing so that the position of the neutral surface can be adjusted to be close to the position of the metal trace, thereby reducing the stress at the bending section of the metal trace. However, because the elastic modulus of the UV-curable adhesive is low, the thickness of the adhesive often must exceed 200 µm in order to adjust the position of the neutral surface to approach the metal trace. According to the relationship between the bending stiffness and the material and geometry at the section region, when the thickness increases, the bending stiffness increases greatly (directly proportional to the cube of the thickness). That is, the thicker the thickness is, the harder it is to bend.

Therefore, the thinning of the flexible substrate not only helps to reduce the stress of the metal trace, but also to helps to reduce the reaction force (Rf) in the bending state as the substrate is thinned. However, if the flexible substrate is too thin, the surface flatness of the substrate decreases, thereby negatively affecting the precision and electrical characteristics of the display area of the flexible OLED display device in fabricating the light-emitting and control devices. A more feasible way is to reduce the thickness of the flexible substrate at the bending region of the lower frame, while retaining the original thickness of the flexible substrate at the display area. However, the existing coating technology for the flexible substrate is difficult to achieve a continuous film of different thicknesses to create a height difference on the surface. In addition, the backside thinning process using a laser on the flexible substrate is complicated, time-consuming, and not suitable for mass production, and it also causes pollution problems to the production line due to a large amount of organic dusts.

In summary, the existing flexible OLED display device and fabrication method thereof, it is difficult for the flexible substrate coating technology to achieve a continuous film of different thicknesses to create a height difference on the surface, thereby negatively affecting the bendability of the flexible OLED display device at the bending region.

Accordingly, it is necessary to provide a display panel and a method of manufacturing the same to solve the problems of the prior art.

SUMMARY OF THE INVENTION

In the existing flexible OLED display device and the fabrication method thereof, it is difficult for the flexible substrate coating technology to achieve a continuous film of different thicknesses to create a height difference on the surface, thereby negatively affecting the bendability of the flexible OLED display device at the bending region.

The present invention provides a flexible OLED display device and a fabrication method thereof, which can effectively improve the bendability of a flexible OLED display device at a bending region, without negatively affecting the characteristics of display components at the display area, so as to solve the technical problems of the existing flexible OLED display device and the fabrication method thereof. The technical problems arise due to the difficulties in achieving a continuous film of different thicknesses to create a height difference on the surface in the flexible substrate coating technology, thereby negatively affecting the bendability of the flexible OLED display device at the bending region, and in turn impacting the display performance.

In order to solve the above problems, the technical solutions provided by the present invention are described below.

The present invention provides a flexible OLED display device, including: a first flexible substrate; an inorganic layer disposed on a surface of the first flexible substrate; a second flexible substrate disposed on a surface of the inorganic layer; a thin film transistor (TFT) layer and an organic light emitting diode (OLED) light emitting layer disposed on a surface of the second flexible substrate; wherein the flexible OLED display device includes a display area and a non-display area located at an end of the display area, the first flexible substrate and the inorganic layer are disposed in the display area, and the second flexible substrate and the TFT layer extend from the display area to the non-display area, wherein a material of the inorganic layer is silicon oxynitride.

In the flexible display device provided by the embodiment of the present invention, a material of the first flexible substrate is polyimide, and a material of the second flexible substrate is the same as the material of the first substrate.

In the flexible display device provided by the embodiment of the present invention, a thickness of the first flexible substrate is greater than a thickness of the inorganic layer, and a thickness of the second flexible substrate is the same as the thickness of the first flexible substrate.

The present invention also provides a method for fabricating a flexible OLED display device, including:

S10, providing a glass substrate, coating a surface of the glass substrate with a first flexible substrate, the first flexible substrate having a bending region and an non-bending region;

S20, forming a release layer on a portion of the first flexible substrate at the bending region;

S30, forming an inorganic layer on a surface of the first flexible substrate, wherein the inorganic layer completely covers the release layer;

S40, coating a second flexible substrate on a surface of the inorganic layer;

S50, sequentially forming a TFT layer and an OLED light emitting layer on a surface of the second flexible substrate; and S60, removing the glass substrate, flipping over the first flexible substrate, and peeling off the portion of the first flexible substrate, the release layer, and a portion of the inorganic layer at the bending region;

S70, bending a portion of the second flexible substrate and a portion of the TFT layer at the bending region, and binding a flexible circuit board and a driving circuit to form the flexible OLED display device.

In the method of fabricating the flexible OLED display device provided by the embodiment of the present invention, the step S20 further includes:

S201, using a mask to mask a portion of the first flexible substrate at the non-bending area; and S202, spray coating a partial releasing agent on a remaining portion of the first flexible substrate that is not masked by the mask to form the release layer.

In the method of fabricating the flexible display device provided by the embodiment of the present invention, the step S60 further includes:

S601, removing the substrate, and flipping over the first flexible substrate;

S602, performing a laser half-cutting to the first flexible substrate at the portion of the bending region; and S603, peeling off the portion of the first flexible substrate, the release layer, and the portion of the inorganic layer at the bending region.

In the method of fabricating the flexible display device provided by the embodiment of the present invention, a material of the inorganic layer is silicon oxynitride In the method of fabricating the flexible display device provided by the embodiment of the present invention, a material of the first flexible substrate is polyimide, and a material of the second flexible substrate is the same as the material of the first substrate.

In the method of fabricating the flexible display device provided by the embodiment of the present invention, a thickness of the first flexible substrate is greater than a thickness of the inorganic layer, and a thickness of the second flexible substrate is the same as the thickness of the first flexible substrate.

The beneficial effects of the present invention are as follows: in the flexible OLED display device and the fabrication method provided by the present invention, the thickness of the flexible substrate at the bending region can be reduced, while the thickness of the flexible substrate at the non-bending region can be maintained as original, thereby improving the bendability of the OLED display device at the bending region, further preventing breakage of the metal trace at the bending region, thus increasing the screen ratio of the flexible OLED display device.

BRIEF DESCRIPTION OF THE SEVERAL VIEWS OF THE DRAWINGS

FIGS. 2, 2A, 2B, 2C, 2D, 2E, 2F and 2G are schematic views showing a method for fabricating a flexible OLED display device of FIG. 2.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The present invention is provided to solve the problems of the existing flexible OLED display device and the fabrication method thereof. The problems arise because of difficulties in achieving a continuous film of different thicknesses to create a height difference on the surface in the flexible substrate coating technology, thereby negatively affecting the bendability of the flexible OLED display device at the bending region, thus impacting the display performance. The embodiments provided by the present invention can solve the above drawbacks.

Figure 1:
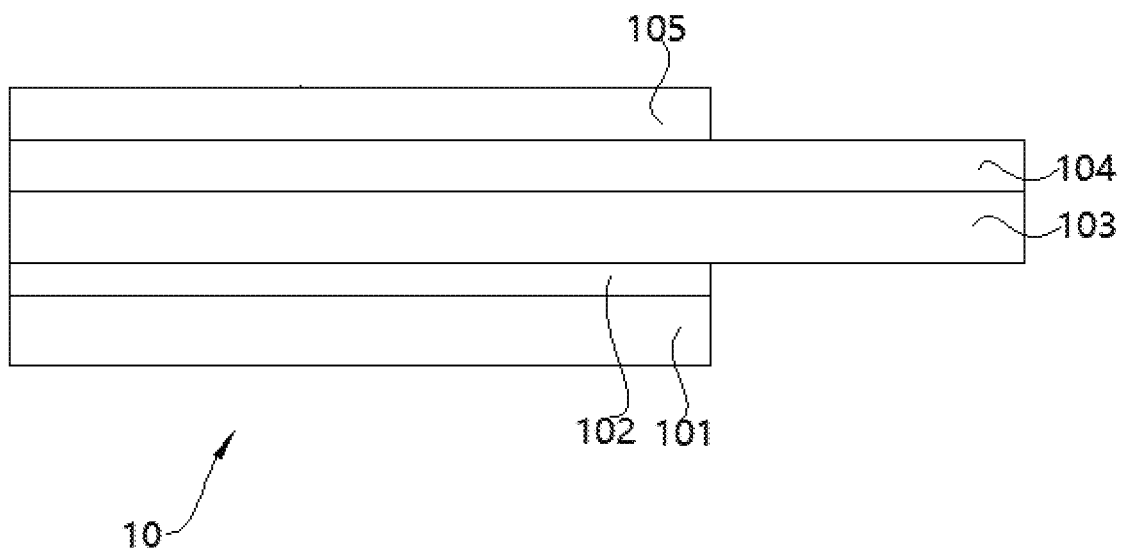
FIG. 1 is a schematic structural view of a flexible OLED display device according to the present invention.

As shown in FIG. 1, the present invention provides a flexible OLED display device 10 including: a first flexible substrate 101, an inorganic layer 102, a second flexible substrate 103, a thin-film transistor (TFT) layer 104, and an OLED light emitting layer 105; wherein the flexibility The OLED display device 10 includes a display area and a non-display area located at one end of the display area; the first flexible substrate 101 and the inorganic layer 102 are located in the display area, the second flexible substrate 103 and the TFT layer 104 extend from the display area to the non-display area.

Specifically, the material of the first flexible substrate 101 is polyimide, and the material of the second flexible substrate 103 is the same as the material of the first substrate 101.

Specifically, the material of the inorganic layer 102 is silicon oxynitride.

Specifically, the thickness of the first flexible substrate 101 is greater than the thickness of the inorganic layer 102, and the thickness of the second flexible substrate 103 is the same as the thickness of the first flexible substrate 101.

Figure 2:
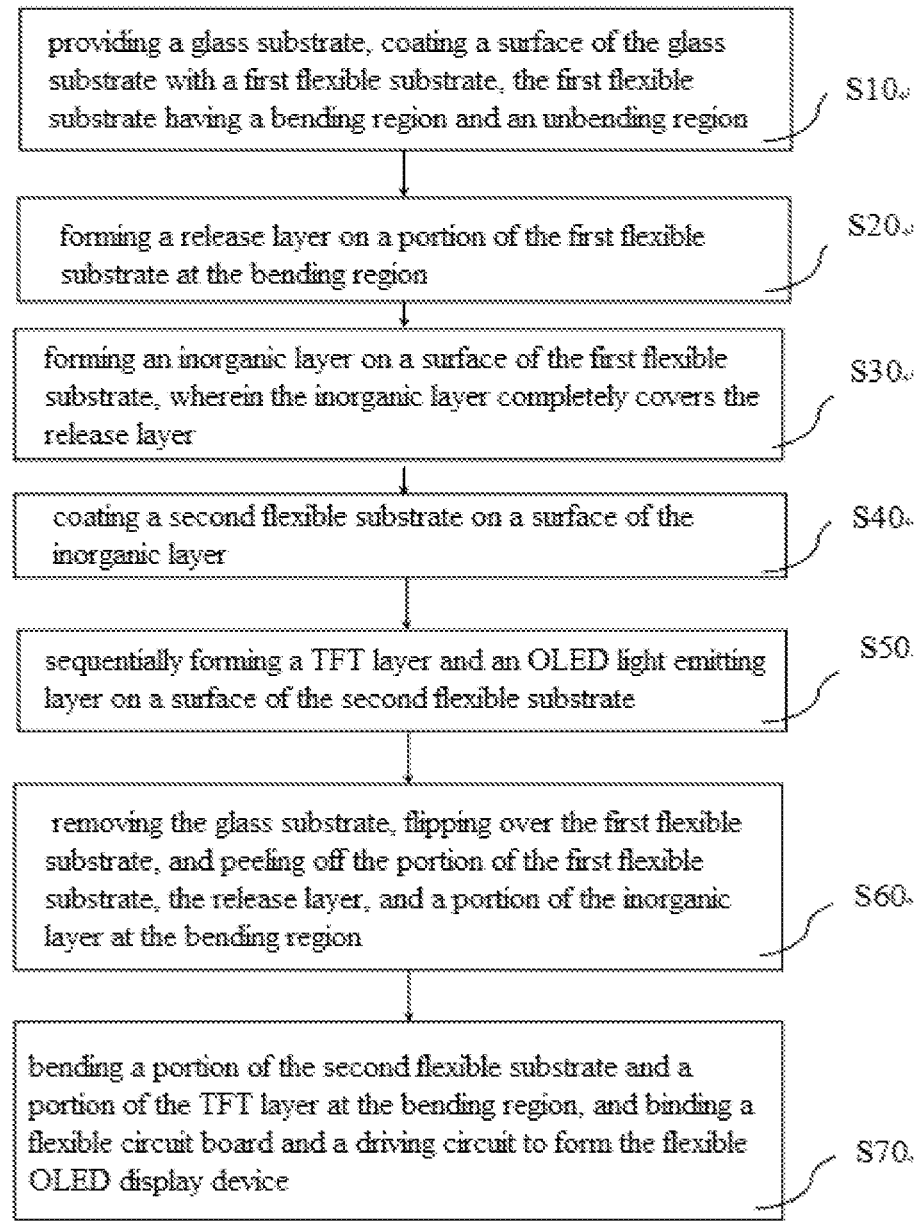
FIG. 2 is a schematic flow chart of a method for fabricating a flexible OLED display device according to the present invention.

As shown in FIG. 2, the present invention further provides a method for fabricating a flexible OLED display device, including the following steps:

S10, providing a glass substrate 201, coating a surface of the glass substrate 201 with a first flexible substrate 202, the first flexible substrate 202 having a bending region and a non-bending region.

Figure 2A:
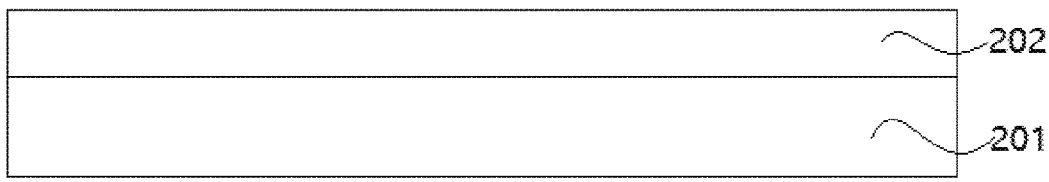
Figure 2B:
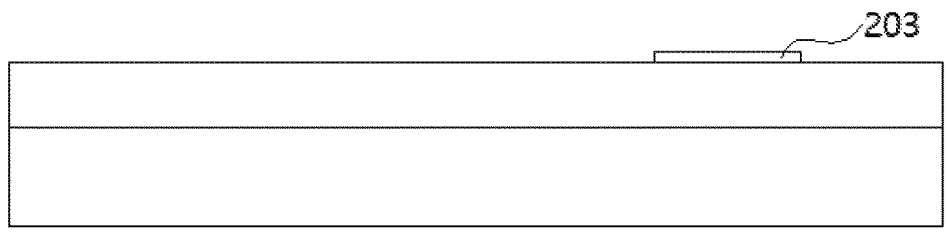

Specifically, the step S10 further includes:

first providing a clean glass substrate 201, and coating the surface of the glass substrate 201 with a flexible substrate material, followed by drying to form a first flexible substrate 202, wherein the flexible substrate material is polyimide, and the first flexible substrate 202 has a bending region and a non-bending region, as shown in FIG. 2A.

S20, forming a release layer 203 on a portion of the first flexible substrate 202 at the bending region.

Specifically, the step S20 further includes:

using a mask to mask a portion of the first flexible substrate 202 at the non-bending area while exposing a portion of the first flexible substrate 202 at the bending area; and spray coating a partial releasing agent on a remaining portion of the first flexible substrate that is not masked by the mask to form the release layer.

S30, forming an inorganic layer 204 on a surface of the first flexible substrate 202, wherein the inorganic layer 204 completely covers the release layer 203.

Figure 2C:
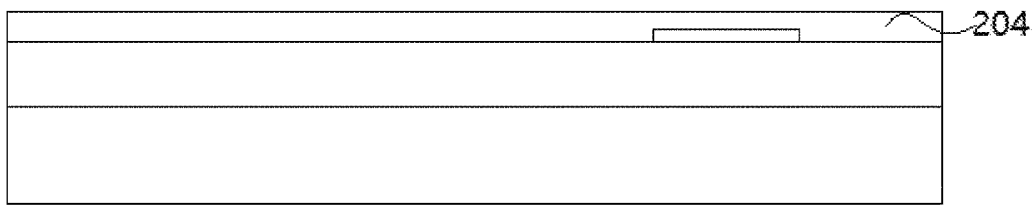

Specifically, the step S30 further includes:

depositing an inorganic layer 204 on the surface of the first flexible substrate 202 using a chemical vapor film, and the inorganic layer 204 completely covers the release layer 203, wherein the material of the inorganic layer 204 is silicon oxynitride, and the thickness of the inorganic layer 204 is smaller than the thickness of the first flexible substrate 202. The inorganic layer 204 may enhance the water barrier property and flatness of the first flexible substrate 202, as shown in FIG. 2C.

S40, coating a second flexible substrate 205 on the surface of the inorganic layer 204.

Figure 2D:
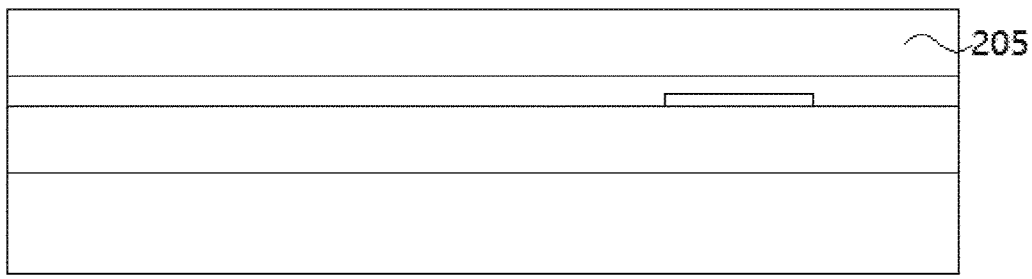

Specifically, the step S40 further includes:

coating a flexible substrate material on the surface of the inorganic layer 204 to form a second flexible substrate 205, wherein a material of the second flexible substrate 205 is polyimide, and the thickness of the second flexible substrate 205 is the same as the thickness of the first flexible substrate 202, as shown in FIG. 2D.

S50, sequentially depositing a TFT layer 206 and an OLED light emitting layer 207 on a surface of the second flexible substrate 205.

Figure 2E:
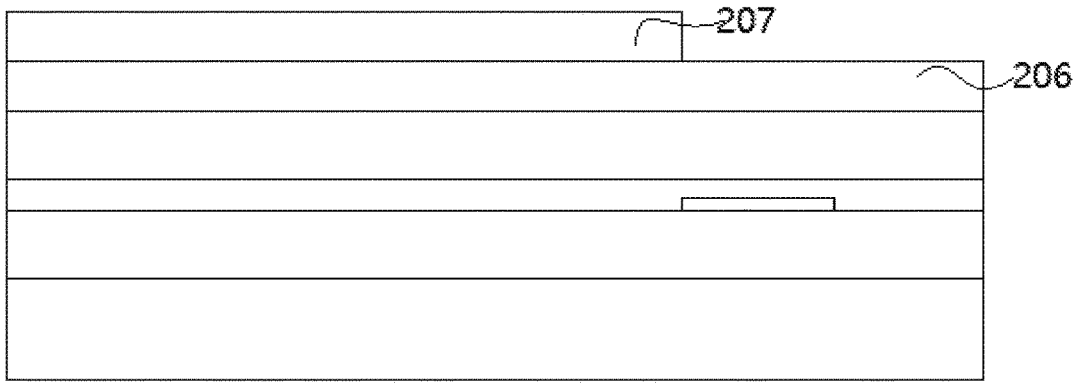

Specifically, the step S50 further includes:

performing a lithography process on the surface of the second flexible substrate 205 to form a TFT layer 206, followed by depositing an OLED light-emitting layer 207 on a portion of the TFT layer 206 at the non-bending region, as shown in FIG. 2E.

S60, removing the glass substrate 201, and flipping over the first flexible substrate 202 to peel off the portion of the first flexible substrate 202, the release layer 203, and a portion of the inorganic layer 204 at the bending region.

Figure 2F:
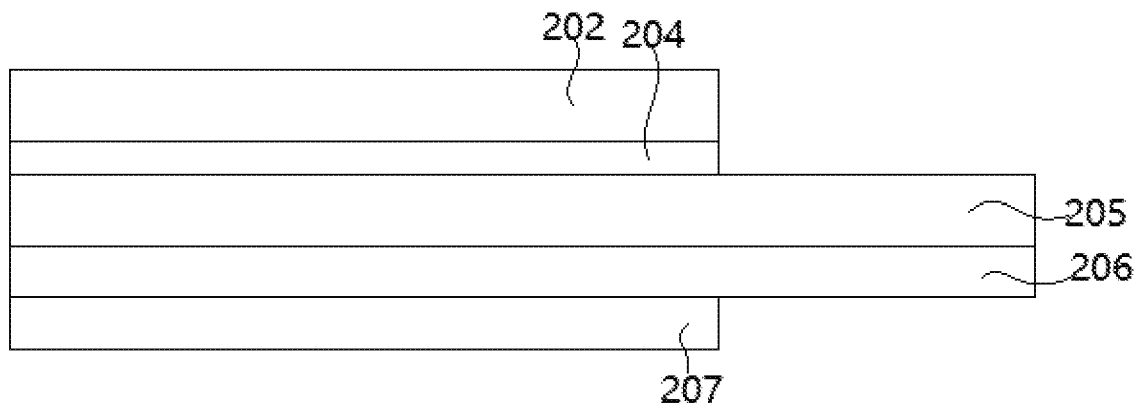

Specifically, the step S60 further includes:

first removing the semi-finished flexible OLED display device from the glass substrate 201 after depositing the OLED light emitting layer 207 on the surface of the TFT layer 206, and then flipping over the semi-finished flexible OLED display device to perform a laser half-cutting on the surface of the first flexible substrate 202, wherein the cutting depth is controlled by laser energy; and finally, tearing off the portion of the first flexible substrate 202 at the bending region. Since the release layer 203 has been formed after coating the first flexible substrate 202 using the mask, a partially release region has been defined. Therefore, a portion of the first flexible substrate 202 at the bending region can be torn off with a very light release force (<5 g/cm). Since only the second flexible substrate 205 is remained at the bending region, the stress of the metal trace at the bending region can be greatly reduced, as shown in FIG. 2F.

S70, bending a portion of the second flexible substrate 205 and a portion of the TFT layer 206 at the bending region, and binding the flexible circuit board 208 and a driving circuit to form a flexible OLED display device.

Figure 2G:
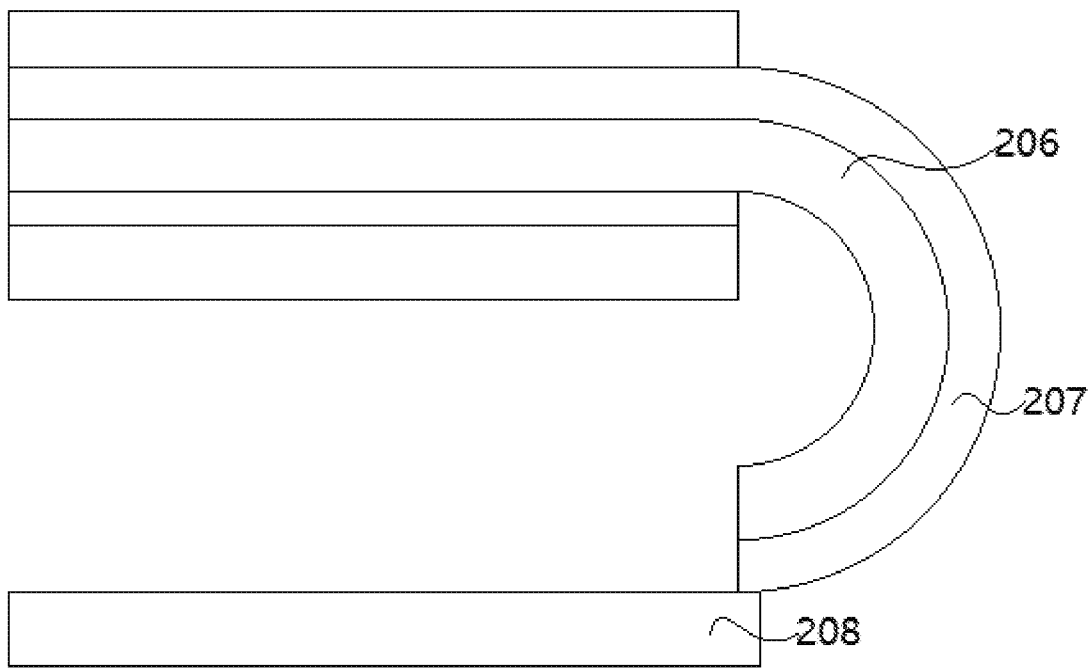

Specifically, the step S70 further includes:

forming a portion of the second flexible substrate 205 and a portion of the TFT layer 206 at the bending region, and binding the flexible circuit board 208 and the driving circuit using an anisotropic conductive film to form a flexible OLED display device, as shown in FIG. 2G.

Figure 3:
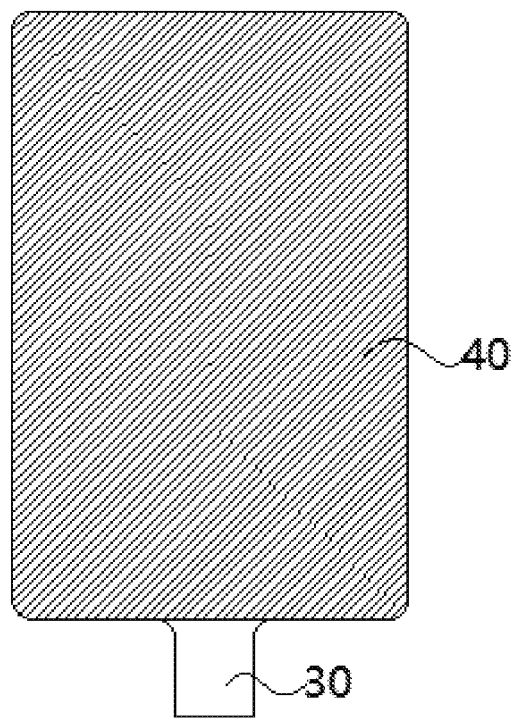
FIG. 3 is a schematic top plan view of the first embodiment of the flexible OLED display device according to the present invention.

FIG. 3 is a schematic top plan view of the first embodiment of the flexible OLED display device according to the present invention, wherein the bending region of the metal trace is a single-layer flexible substrate region 30, and the other region is a double-layer flexible substrate region 40.

Figure 4:
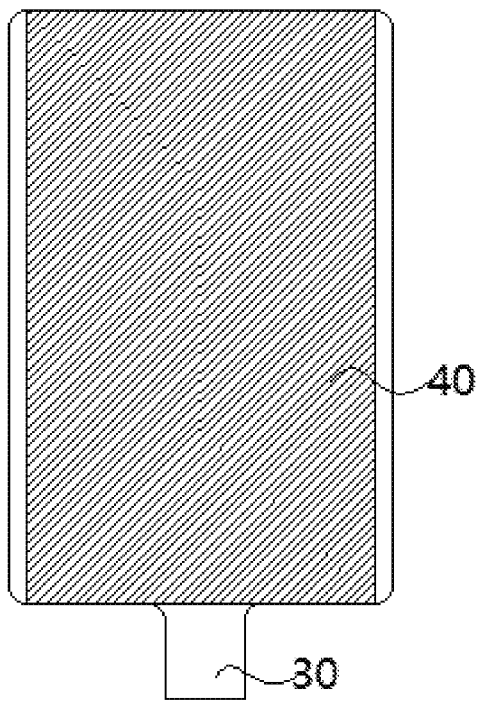
FIG. 4 is a schematic top plan view of the second embodiment of the flexible OLED display device according to the present invention.

FIG. 4 is a schematic top plan view of the second embodiment of the flexible OLED display device according to the present invention. The left and right edge regions of the display area are also a single-layer flexible substrate region 30, in addition to the bending region of the metal trace being a single-layer flexible substrate region 30, and the other regions are double-layer flexible substrate regions 40.

Figure 5:
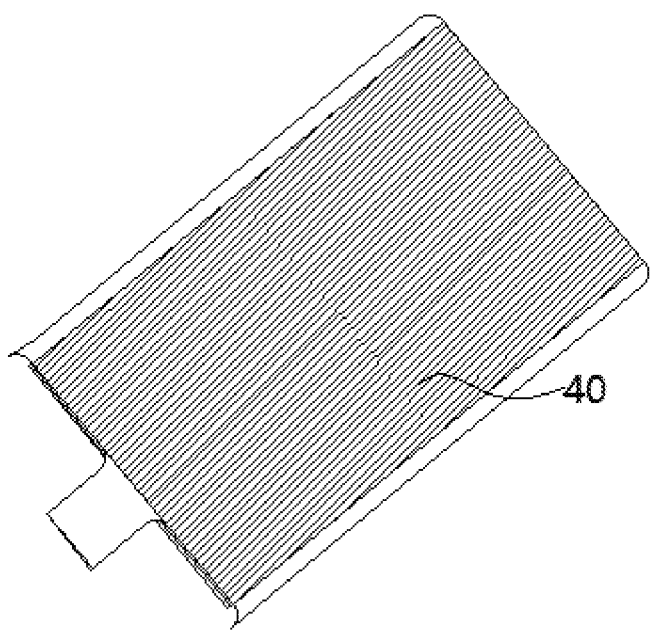
FIG. 5 is a schematic perspective view of the second embodiment of the flexible OLED display device according to the present invention.

FIG. 5 is a schematic perspective view of the second embodiment of the flexible OLED display device according to the present invention, wherein the bending of the left and right edge regions of the display area is mainly applied to a narrow frame display having curved edges, which effectively reduces the risk of component damage caused by edge bending.

The beneficial effects of the present invention are as follows: in the flexible OLED display device and the fabrication method provided by the present invention, the thickness of the flexible substrate at the bending region can be reduced, while the thickness of the flexible substrate at the non-bending region can be maintained as original, thereby improving the bendability of the OLED display device at the bending region, further preventing breakage of the metal trace at the bending region, thus increasing the screen ratio of the flexible OLED display device.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A flexible organic light emitting diode (OLED) display device, comprising:
   a first flexible substrate;
   an inorganic layer disposed on a surface of the first flexible substrate;
   a second flexible substrate disposed on a surface of the inorganic layer;
   a thin film transistor (TFT) layer and an organic light emitting diode (OLED) light emitting layer disposed on a surface of the second flexible substrate;
   wherein the flexible OLED display device comprises a display area and a non-display area located at an end of the display area, the first flexible substrate and the inorganic layer are only disposed in the display area, and the second flexible substrate and the TFT layer extend from the display area to the non-display area.

2. The flexible OLED display device of claim 1, wherein a material of the inorganic layer is silicon oxynitride.

3. The flexible OLED display device of claim 1, wherein a material of the first flexible substrate is polyimide, and a material of the second flexible substrate is the same as the material of the first substrate.

4. The flexible OLED display device of claim 1, wherein a thickness of the first flexible substrate is greater than a thickness of the inorganic layer, and a thickness of the second flexible substrate is the same as the thickness of the first flexible substrate.

5. A method of fabricating a flexible organic light emitting diode OLED display device, comprising:
   S10, providing a glass substrate, coating a surface of the glass substrate with a first flexible substrate, the first flexible substrate having a bending region and a non-bending region;
   S20, forming a release layer on a portion of the first flexible substrate at the bending region;
   S30, forming an inorganic layer on a surface of the first flexible substrate, wherein the inorganic layer completely covers the release layer;
   S40, coating a second flexible substrate on a surface of the inorganic layer;
   S50, sequentially forming a thin film transistor TFT layer and an OLED light emitting layer on a surface of the second flexible substrate; and
   S60, removing the glass substrate, flipping over the first flexible substrate, and peeling off the portion of the first flexible substrate, the release layer, and a portion of the inorganic layer at the bending region;
   S70, bending a portion of the second flexible substrate and a portion of the TFT layer at the bending region, and binding a flexible circuit board and a driving circuit to form the flexible OLED display device.

6. The method of fabricating a flexible OLED display device of claim 5, wherein the step S20 further comprises:
   S201, using a mask to mask a portion of the first flexible substrate at the non-bending area; and
   S202, spray coating a partial releasing agent on a remaining portion of the first flexible substrate that is not masked by the mask to form the release layer.

7. The method of fabricating a flexible OLED display device of claim 5, wherein the step S60 further comprises:
   S601, removing the substrate, and flipping over the first flexible substrate;
   S602, performing a laser half-cutting to the first flexible substrate at the portion of the bending region; and
   S603, peeling off the portion of the first flexible substrate, the release layer, and the portion of the inorganic layer at the bending region.

8. The method of fabricating a flexible OLED display device of claim 5, wherein a material of the inorganic layer is silicon oxynitride.

9. The method of fabricating a flexible OLED display device of claim 5, wherein a material of the first flexible substrate is polyimide, and a material of the second flexible substrate is the same as the material of the first substrate.

10. The method of fabricating a flexible OLED display device of claim 5, wherein a thickness of the first flexible substrate is greater than a thickness of the inorganic layer, and a thickness of the second flexible substrate is the same as the thickness of the first flexible substrate.

* * * * *